US006792326B1

(12) United States Patent
Duignan

(10) Patent No.: US 6,792,326 B1
(45) Date of Patent: Sep. 14, 2004

(54) MATERIAL DELIVERY SYSTEM FOR MINIATURE STRUCTURE FABRICATION

(75) Inventor: Michael T. Duignan, Washington, DC (US)

(73) Assignee: Potomac Photonics, Inc., Lanham, MD (US)

( * ) Notice: Subject to any disclaimer, the term of this patent is extended or adjusted under 35 U.S.C. 154(b) by 0 days.

(21) Appl. No.: 09/744,171

(22) PCT Filed: May 24, 2000

(86) PCT No.: PCT/US00/09819
§ 371 (c)(1),
(2), (4) Date: Jan. 19, 2001

(87) PCT Pub. No.: WO00/72224
PCT Pub. Date: Nov. 30, 2000

Related U.S. Application Data
(60) Provisional application No. 60/135,487, filed on May 24, 1999.

(51) Int. Cl.[7] .................................................. G06F 19/00
(52) U.S. Cl. .................................... 700/119; 430/11
(58) Field of Search ............................ 175/426; 216/66, 216/65; 430/11, 201, 210; 700/112, 113, 117, 119, 120, 121, 213, 98, 159, 166, 183; 156/150

(56) References Cited

U.S. PATENT DOCUMENTS

| 4,541,882 A | * | 9/1985 | Lassen | 156/150 |
|---|---|---|---|---|
| 5,389,196 A | * | 2/1995 | Bloomstein et al. | 216/66 |
| 5,658,698 A | * | 8/1997 | Yagi et al. | 430/11 |
| 5,720,357 A | * | 2/1998 | Fuller et al. | 175/428 |
| 5,773,188 A | * | 6/1998 | Ellis | 430/201 |
| 6,025,110 A | * | 2/2000 | Nowak | 430/200 |
| 6,087,060 A | * | 7/2000 | Chase et al. | 430/201 |

OTHER PUBLICATIONS

Harvey, New Developments In Excimer Laser Micromaching By Image Projection, 1996, IEE,pp. 1–2.*

* cited by examiner

Primary Examiner—Leo Picard
Assistant Examiner—Chad Rapp
(74) Attorney, Agent, or Firm—Rosenberg, Klein & Lee

(57) ABSTRACT

A material delivery system is provided for miniature structures fabrication which has a substrate, a material carrier having a deposition layer, and a laser beam directed towards the material carrier element. A control unit is operatively coupled to the substrate, the material carrier element and laser beam for exposing respective areas of the deposition layer to the laser beam in a patterned manner so that the depositable material of the deposition layer is transferred to the substrate surface for deposition on its surface. The system operates in either an additive mode of operation, or a subtractive mode of operation so that a workpiece does not have to be removed from the tool when change of modes of operation takes place.

26 Claims, 12 Drawing Sheets

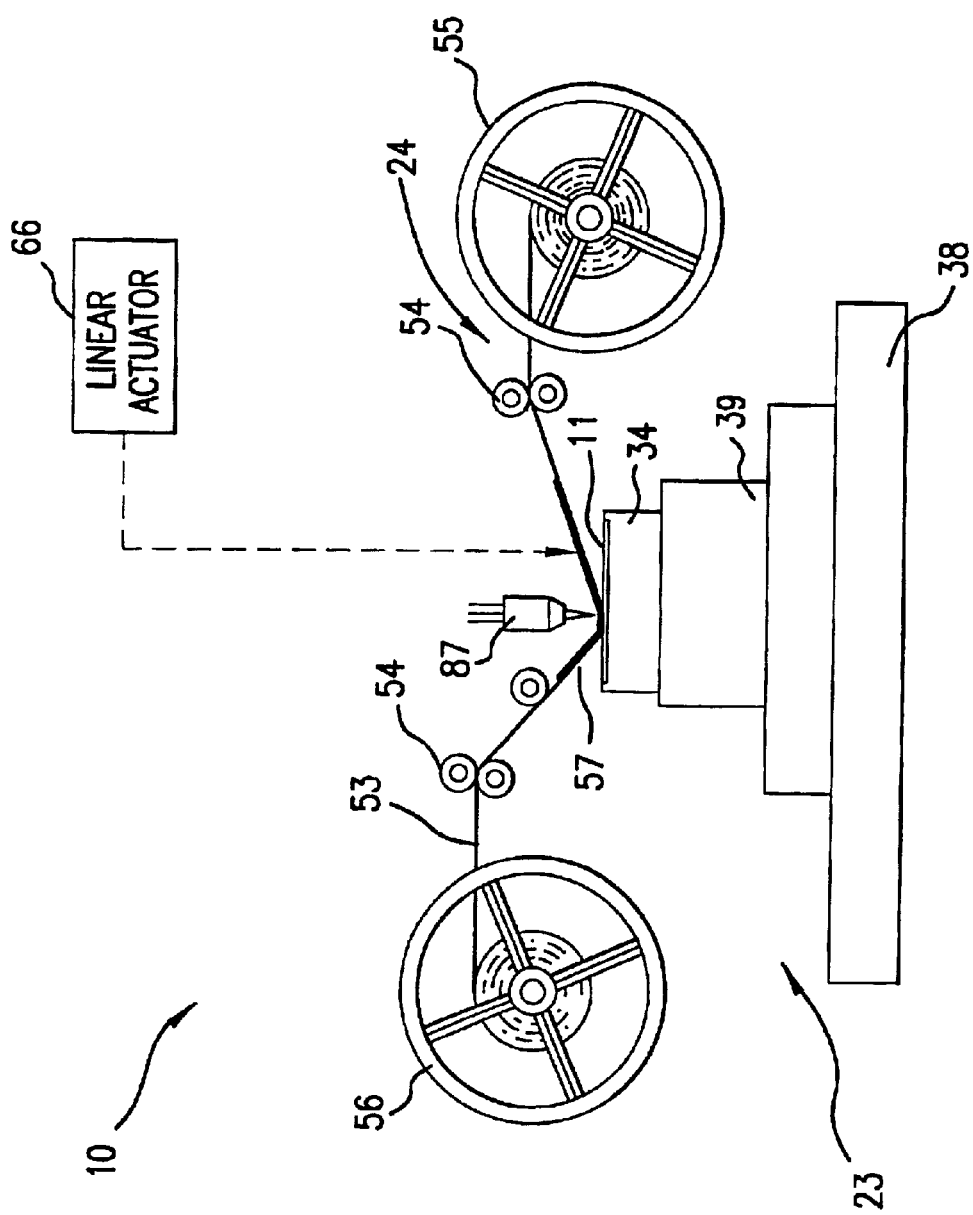

MATERIAL DELIVERY SYSTEM FOR MINIATURE STRUCTURE FABRICATION

REFERENCE TO RELATED APPLICATIONS

This Utility Patent Application is based on a U.S. Provisional Application for Patent Serial No. 60/135,487 filed on 24 May 1999, and PCT Application Serial No. PCT/US00/09819.

FIELD OF THE INVENTION

The present invention relates to a miniature structures fabrication tool and process. Particularly, this invention relates to a material delivery system for enabling an additive Direct Write process in fabrication of complex circuits or structures on different substrate compositions.

Further, the present invention relates to a material carrier element and associated mechanisms for enabling a wide variety of materials to be precisely positioned at a required distance from the substrate for subsequent Direct Write Forward Transfer process.

The present invention additionally relates to miniature structures fabrication tools capable of operating in a "Direct Write" mode of operation and in a "Micromachining" mode of operation. In the "Direct Write" mode of operation, the material carrier element is positioned in an intercepting position with an energy or energetic beam for ablating the deposition layer of the material carrier element for subsequent transfer of the ablated material to the substrate. In the "Micromachining" mode of operation, the material carrier element is displaced from the energetic beam path so that the energetic or energy beam impinges directly onto the surface of the substrate for ablating, evaporating, melting, cutting, drilling, or otherwise removing material therefrom in a patterned fashion.

The present invention further relates to a miniature structure fabrication tool and technique in which actuation/deactuation of the source of energy and change of relative interposition between the source of energy, material carrier element and the substrate is carried out in a precisely synchronized manner.

BACKGROUND OF THE INVENTION

Miniature structures having electrical components are widely used in a variety of consumer and industrial items. Such miniature structures have been found to provide advantages both in performance and price. This has resulted in different manufacturing tools and techniques being developed for fabrication of a variety of complex circuits and structures.

Among those techniques, a Direct Write process has been developed which is an additive process generally implemented as Laser Forward Transfer, Matrix Assisted Pulse Laser Evaporation, or Laser Induced Forward Transfer.

Additive structures created by the Direct Write processes may include optical, chemical, biological, environmental, physical, electromagnetic detectors/sensors, mechanical elements, electromagnetic elements, and a wide variety of passive electronic components. The Direct Write processes are applicable to a wide variety of materials and often use a laser beam as an ablating source of depositable material with subsequent transfer of the ablated material towards the surface of the substrate for deposition thereon.

Another well-known process used in fabrication of miniature structures is laser micromachining in which a laser beam impinges upon a substrate for ablating the surface of the substrate to create various vias, holes, "Micromachining" mode of operation. In the "Direct Write" mode of operation, the material carrier element is positioned in an intercepting position with an energy or energetic beam for ablating the deposition layer of the material carrier element for subsequent transfer of the ablated material to the substrate. In the "Micromachining" mode of operation, the material carrier element is displaced from the energetic beam path so that the energetic or energy beam impinges directly onto the surface of the substrate for ablating, evaporating, melting, cutting, drilling, or otherwise removing material therefrom in a patterned fashion.

The present invention further relates to a miniature structure fabrication tool and technique in which actuation/deactuation of the source of energy and change of relative interposition between the source of energy, material carrier element and the substrate is carried out in a precisely synchronized manner. channels, etc. on the surface of the substrate.

Typically, fabrication of miniature structures, especially of the complex circuits, requires for both additive and subtractive processes to be used on the same workpiece. In conventional fabrication tools, the workpiece has to be transferred between the area where the additive process takes place and the area of the subtractive process.

During the transference between the subtractive and additive areas, the workpiece may be subjected to physical damage, contamination, or re-oxidation of areas freshly exposed during the micromachining process. Additionally, transferring the workpiece from one area to another requires multiple alignments of the substrate, source of the depositable material and the laser in each area.

If only one of these disadvantageous effects is seen on the workpiece a resulting miniature structure created thereon may fail to meet performance requirements, thus decreasing yield of the manufacturing process. To somehow reduce influence of unwanted possible contamination, reoxidation or misalignment, additional measures are usually taken which increase the cost of the resulting microstructures and of the manufacturing process.

Therefore, a new fabrication tool and technique free of disadvantages of the conventional systems is long needed in the miniature structures manufacturing industry.

SUMMARY OF THE INVENTION

It is an object of the present invention to provide a fabrication tool and technique for manufacturing of miniature structures using a unique material delivery system which incorporates a material carrier element capable of intercepting an energy beam in an additive mode of operation and also is capable of being displaced from interception with the energetic beam in a micromachining mode of operation.

It is a further object of the present invention to provide a material delivery system in which the material carrier element has a backing element supporting a deposition layer having at least one, but possibly a plurality of distinct depositable materials, each of which is exposed to an energy beam in a predetermined sequence as required by the particular technological process.

It is another object of the present invention to provide a material delivery system in which a control unit coordinates relative disposition between the source of energy, substrate, and the material carrier element with actuating-deactuating of ablating radiation in a patterned and synchronized fashion.

It is still another object of the present invention to provide a plurality of distinct types of material carrier elements in combination with advancing mechanisms which allow for precise motion control, full automation and effective use of the depositable material.

In accordance with the present invention, a material delivery system for miniature structures fabrication tool includes a substrate, a material carrier element having a deposition layer, an energy beam directed towards the material carrier element, a control unit for changing relative disposition and for exposing respective areas of the deposition layer to the energy beam in a patterned fashion.

Upon exposure of the deposition layer to the energy beam, the depositable material at a predetermined area is ablated and transferred to the substrate for deposition thereon at the respective regions corresponding to the ablated areas of the deposition layer.

The material carrier element (which may be any of the following types: tape, ribbon, disk, pad, etc.) includes a backing element supporting the deposition layer thereon.

Preferably, the material carrier element is maintained in parallel relationship with the substrate at a distance not greater than 25 microns. During the additive mode of operation of the fabrication tool, the control unit changes relative locations between the energy beam and the material carrier element in either of three fashions: scanning of the energy beam over the material carrier element, manipulating the material carrier element with regard to the energy beam, or the combinatorial motion of the energy beam and the material carrier element.

It is important that the deposition layer of the material carrier element includes at least one, but preferably a plurality of distinct depositable materials located at predetermined zones on the material carrier element. As required by the particular technological process, the control unit aligns the energetic beam with a respective one of the zones containing different depositable materials.

The energy beam may be either a laser beam, preferably ultraviolet (UV) laser beam, an ion beam, or an electron beam. The control unit controls the size and the shape of the cross-section of the energetic beam for adjusting size and shape of the written features.

The fabrication tool of the present invention is capable of being operated either in a Direct Write (additive) mode of operation or micromachining (subtractive) mode of operation. In the Direct Write mode of operation, the material carrier element is positioned in an interception path with energy beam, while in the micromachining mode of operation, the material carrier element is displaced away from interception with the energy beam, thus allowing direct access of the energy beam to the substrate for ablating the surface. It is preferred that in micromachining mode of operation a fluence of the energetic beam is at least 1 $J/Cm^2$.

There are several types of material carrier elements used in the material delivery system of the present invention. One of them is a "CD" type material carrier element which is a disk supported on an air table having a flat surface perforated with orifices through which air (or other gas) is forced outward under the pressure. Thus, the disk material carrier element is supported on a thin gaseous cushion. The disk material carrier element is rotated on a thin gaseous cushion (the rotation is carried out with low friction forces and self-stabilizing in the direction normal to the surface) at a rate determined by both the energy beam repetition rate and the radial distance of the source of energy from the disk center in order to pack the radiation ablated "holes" in the deposition layer as tightly as possible to provide maximization of material utilization.

Simultaneously, in conjunction with rotational motion, the disk material carrier element slides in parallel relationships over the surface of the substrate. The substrate is capable of being displaceable independently of the sliding disk material carrier element. Pulsing of the source of energy is synchronized with the substrate motion resulting in tracing a spiral pattern of laser "footprints" on the material carrier element until the material of the deposition layer is completely expanded in a highly efficient manner.

Another type of material carrier element used in the material delivery system of the present invention is a tape material carrier element where opposite ends are supported on a "take-up" reel and a "supply" reel by which the tape material carrier element is transported in either of two directions.

Over the substrate, the tape material carrier element is received and is guided by the tape guide unit which supports the tape material carrier element a predetermined distance above the substrate and which is capable of moving the tape position up to several mm. in a direction normal to the tape travel and parallel to the substrate surface in order to access parallel "tracks" of the tape material.

Preferably, the tape material carrier elements are encased or housed in cassettes which are convenient to ship, handle, store, and which are protected from external contamination.

These and other novel features and advantages of this invention will be fully understood from the following detailed description of the accompanying drawings.

BRIEF DESCRIPTION OF THE DRAWINGS

FIG. 5 is a schematic representation of the tape-type concept for material carrier element of the present invention;

DETAILED DESCRIPTION OF THE PREFERRED EMBODIMENTS

Figure 1:
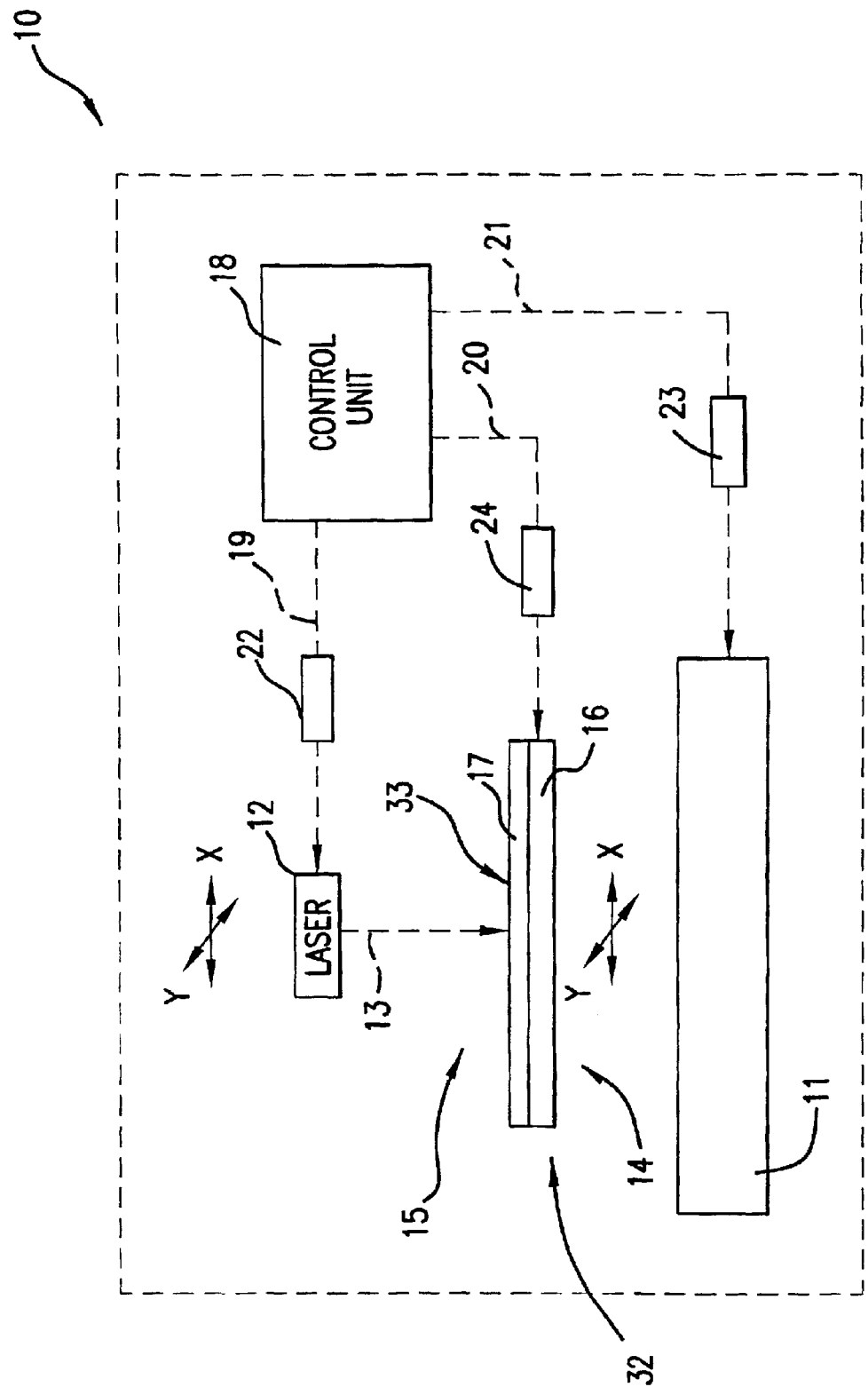
FIG. 1 is a schematic representation of the fabrication tool of the present invention.
Figure 2A:
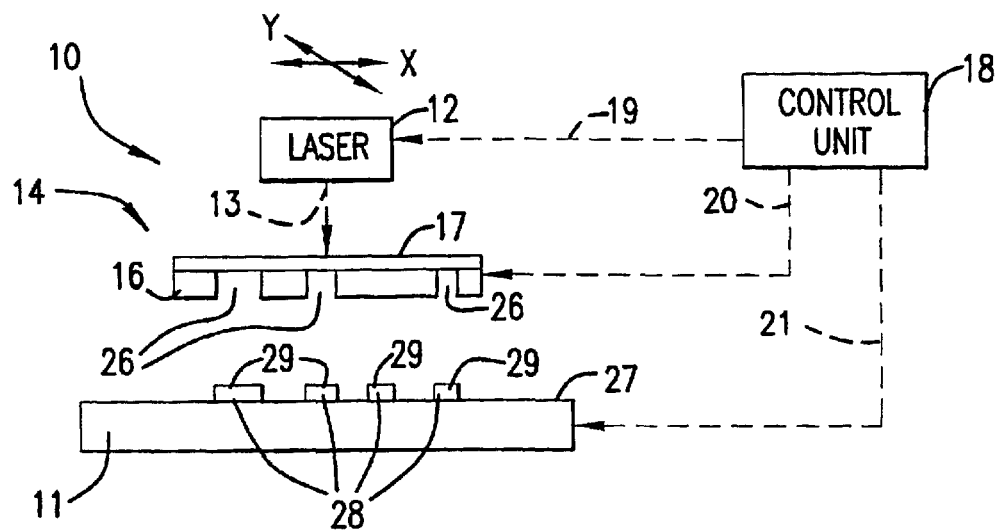
FIGS. 2A and 2B show schematically an "additive" and "subtractive" mode of operation of the fabrication tool of the present invention.
Figure 2B:
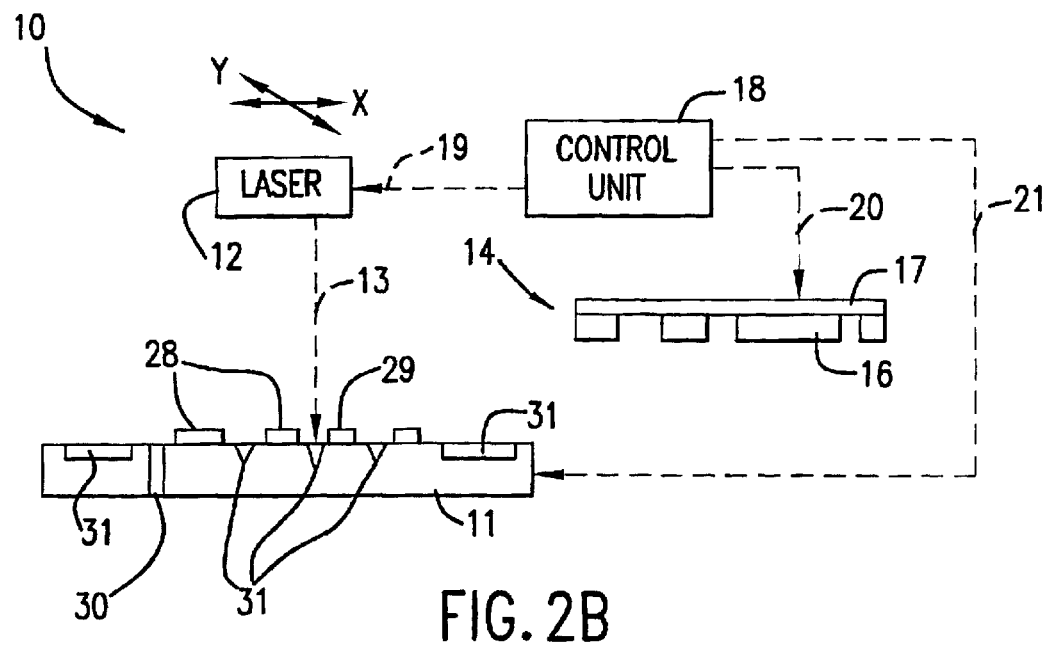

Referring to FIGS. 1–2B, the apparatus 10 of the present invention includes a substrate 11, a source of energy 12 capable of generating an energy or energetic beam 13, a material carrier element 14 displaceably positioned in a gap 15 formed between the source of energy 12 and the substrate 11, a deposition layer 16 supported on a backing material 17 of the material carrier element 14, and a control unit 18 operatively coupled to the source of energy 12 through the transmission link 19 and to the material carrier element 14 through the communication link 20.

The material carrier element (or "ribbon") comprises a transparent backing material 17 (transparent to the transfer laser beam) upon which is coated a thin (~1–10 μm) layer 16 of the material to be deposited. Compositions transparent to laser beams include fuse silica, borosilicate glass, polyester films such as Mylar, as well as a wide variety of other compositions. Two types of the material carrier elements are envisioned, including:

(a) a disk—"ribbon", i.e., a circular window spinning about its axis over the substrate and tracking radially when the laser is firing; and (b) a flexible tape in a reel-to-reel mechanism which moves along its long axis during deposition. The tape also can move laterally to expose new material to the impinging laser beam.

The control unit 18 is operatively coupled to the substrate 11 through the communication link 21. Depending on the mode of operation of the fabrication tool 10 (to be discussed in detail in further paragraphs), either the material carrier element 14 or the substrate 11 will serve as a target exposed to the energy beam 13.

Through the communication link 19, the control unit 18 actuates/deactuates the source of energy 12 to generate or terminate the energy beam 13, regulates the parameters of the energy beam 13 such as fluence, size and shape of the cross-section of the beam, etc., as well as changes relative position between the energy beam and the material carrier element and/or the substrate in a patterned fashion.

In this manner, the control unit 18 "scans" the energy beam 13 over the surface of the target (the substrate 11 and/or material carrier element 14) either by moving the source of energy 12 in X-Y directions or by changing the angular relative position of the energy beam 13 with regard to the target in a patterned fashion.

In order to change the relative disposition or location between the energy beam 13 and the target in a patterned fashion, the control unit 18 alternatively can control the target through the communication link 21 (for the substrate 11) or through the communication link 20 (for the material carrier element 14) by either keeping the energy beam immovable or moving the energy beam 13 in a coordinated fashion with the target.

In order to provide the control unit 18 with the function of manipulating the energy beam 13, the communication link 19 includes an electromechanical mechanism 22 known to those skilled in the art which is a unit for translating the electrical signal output from the control unit 18 into a mechanical displacement of the source of energy 12 or into respective changes of an optic system of the source of energy 12.

In the same manner, the communication link 21 includes an electromechanical mechanism 23 which translates the electrical signal from the control unit 18 into the mechanical displacement of the substrate 11 in a patterned fashion.

Through the communication link 20, the control unit 18 is capable of manipulating the material carrier element 14 within the gap 15 along the X-Y direction so that the material carrier element 14 may be displaced either away from interception with energy beam 13 or to a position intercepting with energy beam 13. Similar to the mechanisms 22 and 23, a mechanical displacement unit 24 is included into the communication link 20 to translate the signal generated by the control unit 18 into the mechanical displacement of the material carrier element 14. The "ribbon" transport mechanism is designed to:

(a) during the "additive" mode of operation,
ensure that each laser pulse "sees" a new area of an untransferred material; and
move the "ribbon" to a new "track" of different material that might reside on the same "ribbon", and (b) during the "subtractive" mode of operation,
move to a laser transparent area of the "ribbon", or
move out of the beam entirely to allow UV laser micromachining.

Through communication links 19, 20, and 21, the control unit 18 also monitors positions of the source of energy 12, material carrier element 14, and the substrate 11, respectively, in order to coordinate the relative interposition between the aforesaid units of the fabrication tool 10 with activation-deactivation of the source of energy for pulsing-position synchronization that is important for the high quality of manufactured miniature structures generally needed.

Control unit 18 operates apparatus 10 of the present invention in two modes of operation: "material removal" (or subtractive) mode of operation and "material transfer" (or additive) mode of operation. In the "material removal" mode of operation, the material carrier element 14 is displaced away from interception with the energy beam 13, while in the "material transfer" mode of operation, the material carrier element 14 intercepts the energy beam 13 path. Thus, the apparatus 10 of the present invention performing both as a Direct Write and a Micromachining (DW/MM) machine, possesses the ability to accomplish pattern tasks such as laser surface cleaning as well as direct deposit of metal, ceramics, polymers, etc. in situ, in an air atmosphere and at generally room temperature.

In the subtractive mode of operation, patterned ablating, evaporation, melting, cutting, and cleaning processes of the present invention may be carried out. In the additive mode of operation, miniature structures are formed by depositing a depositable material from the deposition layer 16 onto the surface of the substrate.

The control unit 18 can change the mode of operation of the apparatus 10 in any required sequence. For example, as best shown in FIG. 2A, the control unit 18, initially sets the apparatus 10 in the additive mode of operation by moving the material carrier element 14 into a position intercepting the energy beam 13 in a manner to perform a deposition step. This is accomplished by changing the relative disposition between the energy beam 13 and the material carrier element 14 in accordance with a predetermined pattern, thereby ablating areas 26 and depositing a depositable material contained in the deposition layer 16 of the material carrier element 14 onto the substrate surface 27 at predetermined locations 28 for creating miniature structures 29.

After the "additive" mode of operation has been finished, the control unit 18 changes the mode of operation of the apparatus 10 to the "subtractive" mode of operation, best shown in FIG. 2B, by displacing the material carrier element 14 from interception with the energy beam 13. This controlled displacement allows direct access of the energy beam 13 to the surface 27 of the substrate 11 which now has deposited films 29 thereon.

By changing relative positioning between the energy beam 13 and the substrate 11 in accordance with another predetermined pattern, either cleaning the surface 27 in a patterned fashion or creating vias 30, channels 31, etc. may be accomplished. Alternatively, the "subtractive" mode of operation may be performed prior to the "additive" mode of operation for cleaning the surface 27 of the substrate 11 before the material transfer process.

Although not shown in FIGS. 2A–2B, the control unit 18 can intermittently change the modes of operation of the apparatus 10 between the "material transfer" mode of operation for depositing structures and the "material removal" mode of operation for excavating layers of the structure in any programmed sequence.

The manufacturing process of the present invention, thus may continue in this manner and may include a plurality of "material removal" and "material transfer" modes of operations performed in a required sequence for fabrication of multi-layered or stacked-up miniature structures known to those skilled in the art.

One of the major advantages of the apparatus and technique of the present invention is that the substrate 11 does not have to be removed from its position when the modes of operation of the apparatus 10 change so that any possible physical damage associated with transportation of the substrate as well as contamination and reoxidation of the freshly exposed areas of the surface of the substrate is avoided.

Referring again to FIG. 2A, by moving the material carrier element 14 into the gap 15 formed between the substrate 11 and the source of energy 12, the control unit sets the "additive" mode of operation of the fabrication tool 10.

In this mode, the energy beam impinges upon the material carrier element 14 which is provided with a material composition transparent to the radiation and modifies the deposition layer 16 so that the depositable material contained in the deposition layer 16 transfers from spots 26 onto the surface 27 of the substrate 11. Deposition is accomplished generally at locations 28 freshly exposed on the surface 27 of the substrate 11 during a previous cleaning process. Thus, miniature structures 29 (deposition films) forming electrical components are created at the predetermined locations on the surface of the substrate.

A unique material delivery system 32 of the present invention enables a wide variety of materials to be precisely positioned near the substrate 11 for subsequent Direct Write processes with the ability to create complex circuits or structures in a conformal manner on different substrates.

An important element of the material delivery system 32 is the material carrier element 14 which includes the backing material 17 that is transparent to the radiation of the source of energy 12. The energy source can be composed of either ions, electrons, or photons, and can be an ultraviolet laser, such as an excimer lasers including a waveguide excimer laser or a frequency multiplied solid state laser. The excimer laser can be pulsed and can be pulsed at a rate above 10 Hz. For the sake of simplicity, the laser will be further referred to as a source of energy. Thus, the backing element 17 is transparent to the UV radiation for allowing the laser beam 13 to impinge upon the deposition layer 16.

The deposition layer 16 contains at least one, but may include a plurality of depositable materials which are to be transferred to the substrate 11 for deposition thereon. The Direct Write process of the present invention is applicable to a wide variety of materials since the material carrier element 14 is capable of simultaneous multi-component content, i.e., several materials, such as metals, insulators, etc., which can be held in different areas of the same material carrier element and selected under control of the control unit 18 as the fabrication process demands.

According to the shape of the backing element 33, the material carrier element 14 of the present invention may be either of a tape type, ribbon type, disk type, or a pad type. It is important that the material carrier element be maintained at a fixed distance from the substrate 11. The distance between the material carrier element 14 and the substrate 11 is important for optimized spatial resolution and optimum utilization of deposited materials. Generally, at atmospheric pressure, this distance between substrate 11 and carrier element 14 should not exceed 25 microns. To maintain the fixed distance between the material carrier element and the substrate, the material carrier element has either a fixed spacer support or a moving spacer support as will be further described in detail.

In the "additive" mode of operation, the control unit 19 changes the relative position between the laser beam 13 and the material carrier element 14 in a manner that each pulse falls on areas not previously ablated. Otherwise, the laser energy transmitted through a "hole" in the material carrier element may damage previously deposited structures or underlying features on the substrate 11.

Additionally the relative movement between the material carrier element 14 and the laser beam 13 is carried out in a manner to expose only non-ablated areas of the deposition layer adjacent to already ablated areas thus providing efficient utilization of the depositable material of the deposition layer 16.

The spatial resolution of the Direct Write technique, is generally limited by the attainable laser spot size or shape and by the precision of the motion system or beam steering mechanism. Adjustment of the laser spot size and/or shape, the size and shape of the features are varied. Using laser forward transfer, gold lines have been obtained with a width less than 8 microns. Written features have been subsequently trimmed with one micron precision. Additionally, 10 micron wide conducting lines have been written followed by 50 micron contact pad without a tool change. The Direct Write processes carried out in the fabrication tool 10 of the present invention attained write speeds of meters per second, while maintaining a position tolerance to one micron. A 100 KHz pulse laser with a laser spot of 50 micron diameter at the material carrier element requires that either the material carrier element or the laser beam translate at a linear rate of 5 meters per second.

The material carrier element may move materials with sufficient velocity to obtain deposition rates as large as 1,000 $mm^3$/minute. Commercial mechanical techniques such as Micro-Pen or Ink jets, do not match this combination of speed and precision of the technique of the present invention.

One of the greatest strengths of the Direct Write process of the present invention is the wide scope of materials that can be deposited. This material may include completely insoluble, very high or very low melting material, metals, oxides, ferrites, and even sensitive polymers. It was shown that material carrier element utilization for a round spot laser beam may be greater than 75% and even higher for a rectangular "footprint". Recovery of pressure materials requires only dissolution of the less than one micron thick matrix layer.

Figure 3:
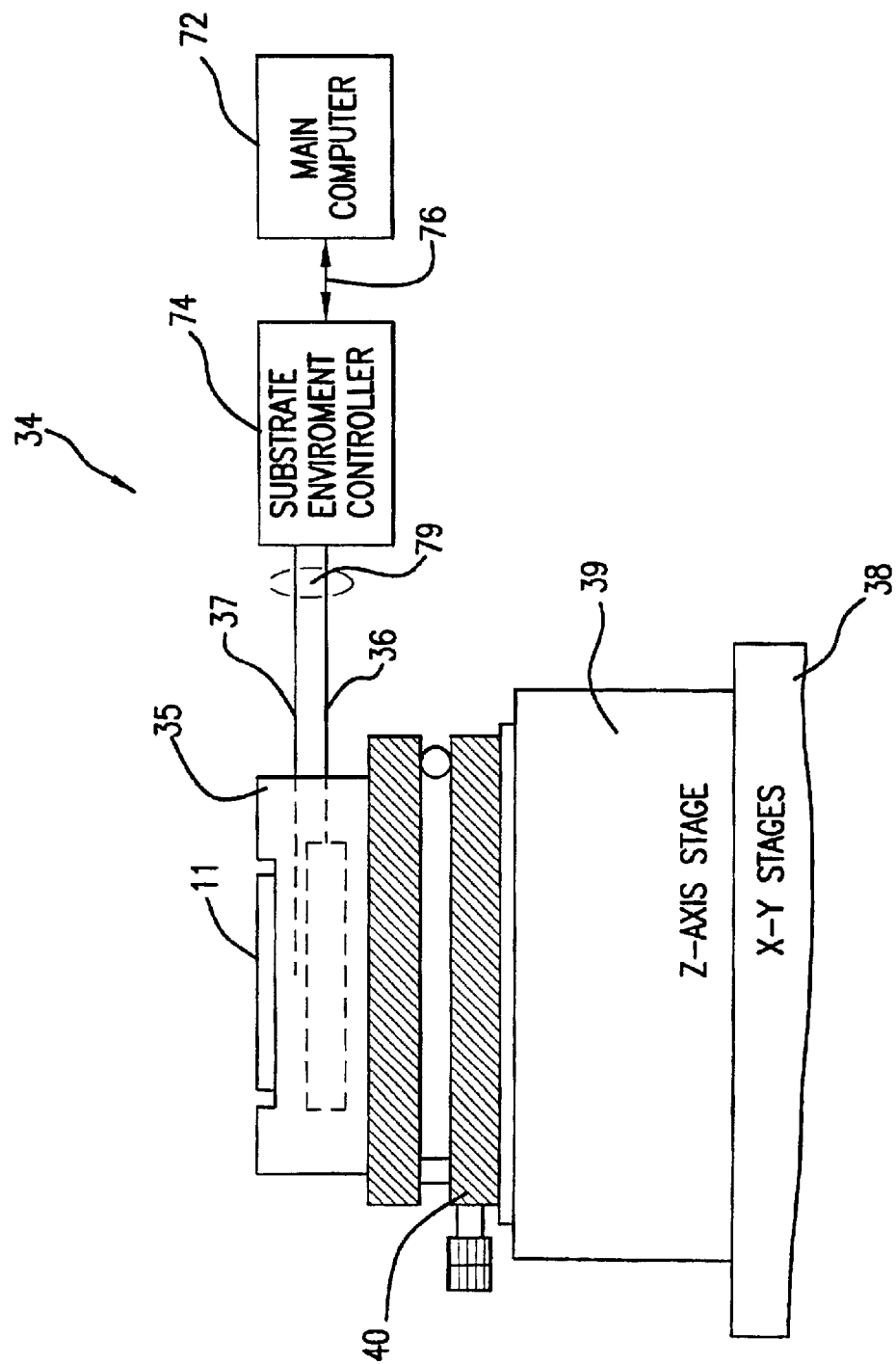
FIG. 3 is a cross-section of a substrate holding structure in the fabrication tool of the present invention.

As previously discussed, proper spacing and maintaining the substrate and material carrier element in substantially parallel relationship is of importance. FIG. 3 shows a cross-section of a substrate holding chuck (or substrate fixture) 34 for holding the substrate 11 and for adjusting the position thereof.

The substrate holding chuck 34 includes a hot plate 35 (or heater block) which has a heater 36 and a thermocouple 37 operating in a closed loop manner to achieve a constant temperature adjustable from ambient to approximately 500° C., preferably between 20° C. and 200° C. Heating the substrate improves the efficiency of the deposition and increase of the quality of the transferred materials. Optionally, localized heating can be provided by a coaxial infrared laser beam (not shown).

The substrate holding chuck 34 includes a pair of thermal driven high resolution X-Y stages 38 supporting the computer controlled Z-axis stage 39 which is required to both accommodate various substrate thicknesses, and to adjust for any significant built-up height (thickness) of the deposited features on the substrate 11.

A dual axis tilt stage 40 which is a stiff mirror mount is mounted on the Z axis stage 39 for removing any net wedge in the substrate. Thus, by using X-Y stages 38, Z axis stages 39, and dual axis tilt stage 40, controlled by the control unit 18, independently each from the other, the surface of the substrate is maintained in parallel relationship to the material carrier element and spaced therefrom by a predetermined distance.

As discussed in previous paragraphs, the material carrier element 14 may have different shapes and be of different types. One of the material carrier element types is a disk material carrier element (CD platter), shown in FIGS. 4A, 4B and 6. The disk material carrier element 14 is supported on an air table 41. The table 41 provides a flat surface which is perforated by a plurality of small orifices 42 through which air or other gas supplied through the gas supply 43 and is forced outward under increased pressure. This creates a thin cushion 44 of air (or other gas), typically 10–25 microns thick. In this manner, the disk material carrier element 14 is supported on the air cushion 44 above the surface of the air table 41. The gases supplied by gas supply 43, such as argon, oxygen, or air can flood the interaction region between the laser and the material carrier element thus providing an additional element of control over the laser deposition and annealing process.

The material carrier element 14 is rotated about the central axis 45 by a spindle 46 which is operatively coupled to the rotation stage 47 supported in the vertical stage 48 which is further supported by the horizontal stage 49. The spindle 43 can be pneumatically coupled to the center of the disk material carrier element 14 by means of a suction cup type structure.

The rotation of the material carrier element 14 is initiated by a motor coupled to the rotation stage 47 which is connected to the disk material carrier element through the spindle 46. The rotation of the disk material carrier element is accomplished with minimal friction and is self-stabilizing in the direction normal to the surface of the air table 41.

The motor rotates the disk material carrier element 14 at a rate determined by both the laser repetition rate and the radial distance of the laser from the disk center with the ultimate goal to pack the laser ablated areas in the deposition layer 16 as tightly as possible in order to maximize material utilization. During the "additive" mode of operation, with the laser stationary, the spinning material carrier element slides in a horizontal direction in the direction away from the substrate to the edge of the air table.

Simultaneously, the substrate 11 moves in the X-Y plane under the control of the control unit 18 in a prescribed manner to write out the desired features on the substrate. During the relative changes of interposition between the substrate 11 and the disk material carrier element 14 laser actuation-deactuation is synchronized with the substrate motion, resulting in a spiral pattern of laser "footprints" on the material carrier element's deposition layer 16 (as best shown in FIG. 49) until the depositable material of the deposition layer 16 is expanded. The motion of the disk material carrier element 14 is similar to the way a digital audio CD-player tracks the encoded beats on the spinning surface.

Figure 4A:
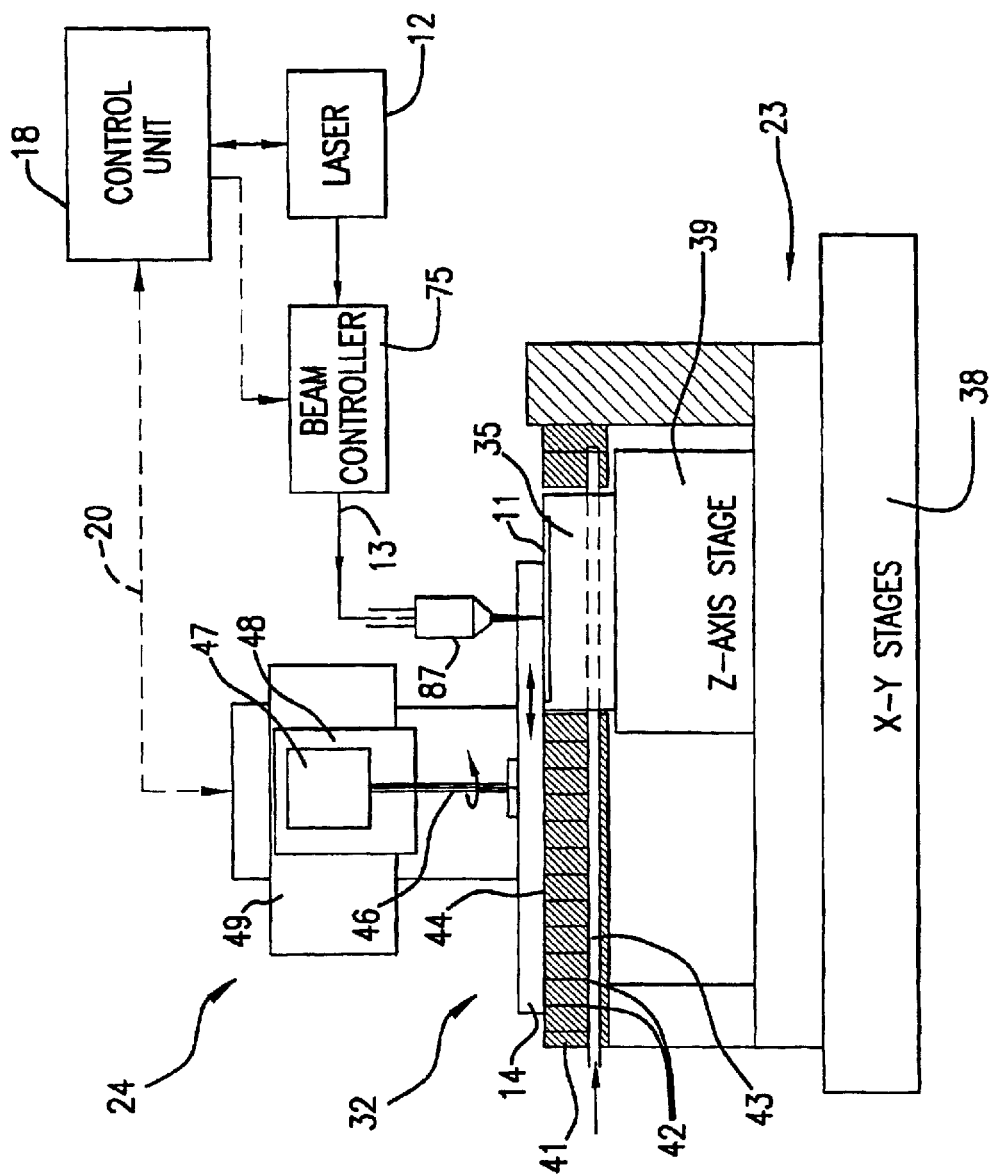
FIG. 4A is a schematic representation of the CD-type rotating material carrier element concept of the present invention.
Figure 4B:
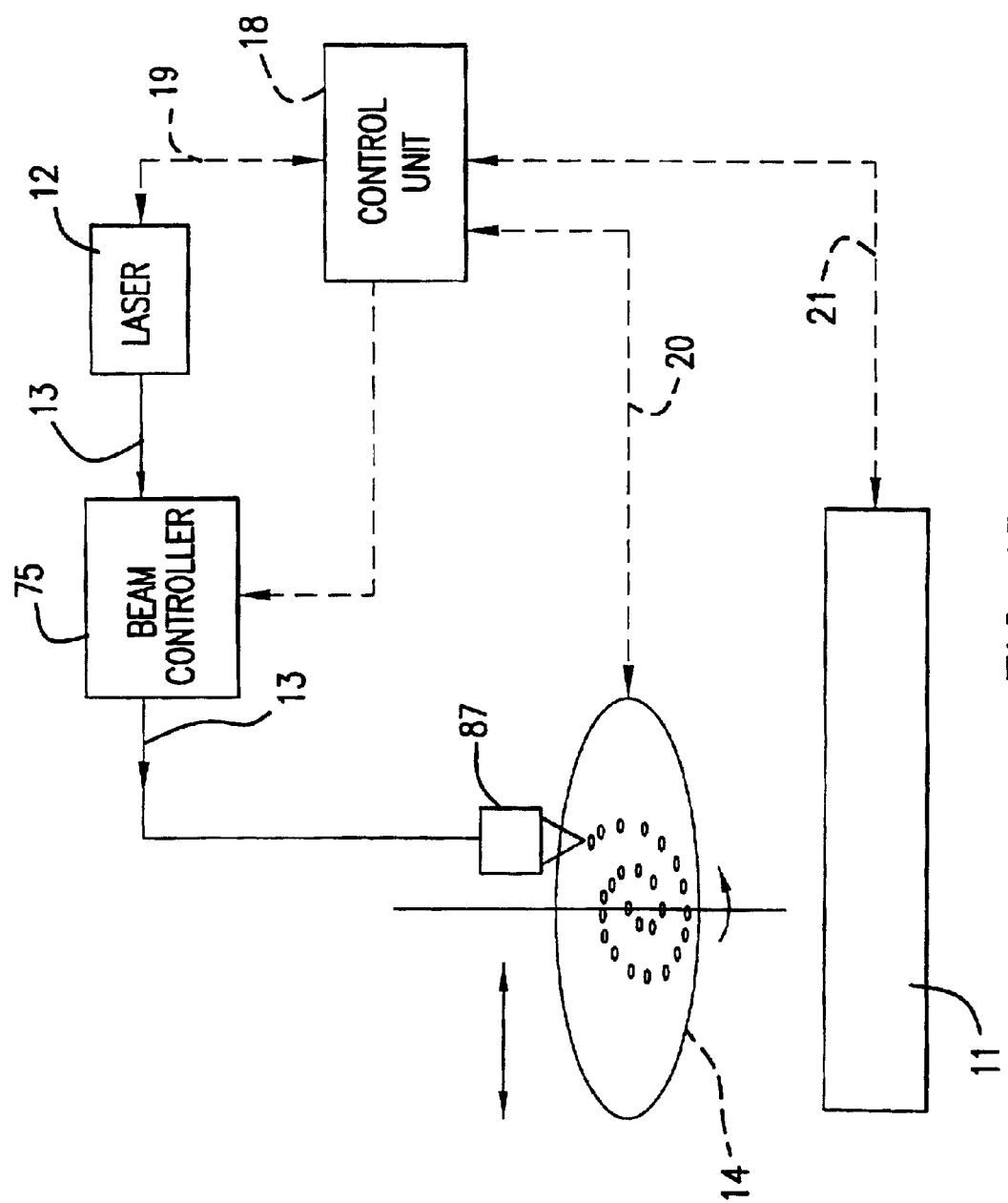
FIG. 4B is a schematic representation of the CD-type spinning and radially advancing material carrier element showing the pattern of modification of the deposition layer thereof.

Thus in the CD approach material carrier element, best shown in FIG. 4A, the material carrier element "floats" on a thin film of a gas pumped through the air table 41, and a servo motor coupled to the rotation stage 47 rotates the material carrier element while translation is accomplished. Both the material carrier element 14 and the substrate 11 move independently, in three axes. The rotation stage 47 is mounted on the X-Y horizontal stage 49 which has enough travel to allow the CD material carrier element to be moved completely out of the laser beam view.

Material carrier elements can be easily changed when they are spent or when a material change is required. When spinning is terminated and the air table still active, the rotation motor and the disk material carrier element 14 is automatically moved away from the substrate to a predetermined position. The disk material carrier element is then detached from the spindle 46. The design of the CD type of the material carrier element makes it easier for the operator to slide the old material carrier element out and slide the new one into position.

Figure 6:
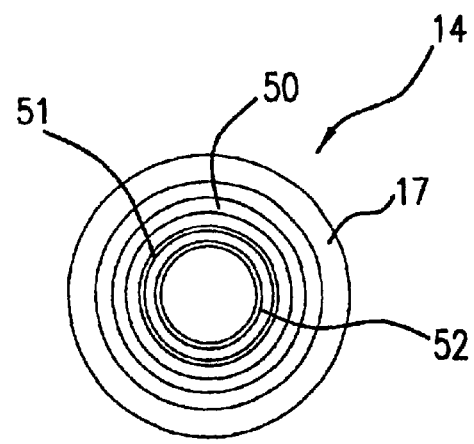
FIG. 6 is a representation of the surface of the disk material carrier element showing a disposition of the plurality of depositable materials thereon.

As best shown in FIG. 6, the disk material carrier element 14 may contain multiple annular bands 50–52 each containing a different powder material in a uniform matrix. Switching materials for deposition requires only the translation of the material carrier element to a position where a laser beam is aligned to a band containing a required composition.

Another type of the material carrier element is generally called tape "reel-to-reel" material carrier element best shown in FIG. 5. This type of the material carrier element includes a tape backing element 53 which is a thin flexible material carrying a deposition layer of depositable material (or a plurality of depositable materials disposed as parallel tracks thereon).

The tape backing element 53 is extended between two reels, wherein pinch rollers 54 pull (with a constant force) tape dispensed from a supply reel 55 through a path guided by positioning rollers. On the other end of the tape, opposite to the supply reel 55, there is a "take-up" reel 56 which winds the tape backing element 53. Feeding the thin flexible material of the tape backing element 53 at a desired rate is important for the automation of the manufacturing process and the motion control.

A tape guide unit 57 supports the tape backing element 53 at a height of approximately 25 microns or less above the surface of the substrate 11. The tape guide unit 57 is coupled to a linear actuator 66 which steps the tape position up to several millimeters in the direction normal to the tape travel and parallel to the substrate surface.

Figure 7:
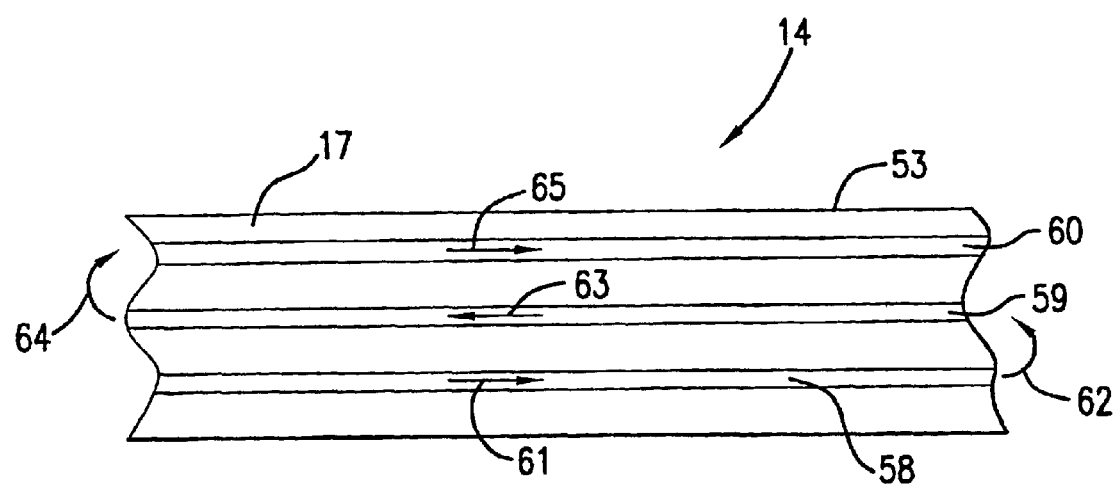
FIG. 7 is a representation of the surface of the tape material carrier element showing a multi-track arrangement of depositable materials disposed thereon.

The purpose of the stepping is to access parallel "tracks" of the backing material without having to change the tape material carrier element 14. The tape transport can operate bi-directionally, stepping to the next track after a full length of the previous track passed, and reversing tape direction. For instance, as best shown in FIG. 7, the tape material carrier element 14 has three "tracks" of different depositable materials, 58, 59, and 60, respectively.

The relative position between the material carrier element 14 and the laser 12 is changed initially by aligning the laser beam 13 with the track 58 and providing sliding of the laser beam along the track 58 as shown by the arrow 61. After the full length of the track 58 has been covered, the linear actuator 66 moves the tape with relation to the laser beam 13 as shown by the arrow 62, thus aligning the laser beam with the track 59.

The direction of passing the tape is reversed, and along the track 59, the relative motion between the laser beam and the tape changes in the direction shown by the arrow 63. When the length of the track 63 is completely covered, the linear actuator 66 steps the tape guide in the direction shown by the arrow 64 and aligns the laser beam 13 with the track 60 for displacing the tape material carrier element with respect to the laser beam 13 in a manner to allow the laser spots to cover tracks 60 in the direction shown by the arrow 65. The purpose of such a travel pattern is to access parallel tracks of tape material without having to change the tape once the length thereof has been covered.

Another important function of the translatable tape guide unit 57 is to provide a way of removing the tape completely from the laser beam path. The tape drive would most likely be stopped before the actuator pulls the tape material carrier element from the beam path. The tape material carrier elements are handled as cassettes that have a number of advantages that may greatly enhance commercial viability of the tape material carrier element. Cassettes are easy to ship, handle and store, they are also protected from outside contamination and can help safeguard machine operators from contact with potentially hazardous materials on the tape material carrier element. The cassette model also lends itself to automation. The cassette concept of the tape material carrier element is similar to video tape cassettes. The material carrier element cassettes may in a similar manner be operated hands-free for long period sof time with minimal wear.

The multi-track concept provides for a maximum tape utilization. It is also possible to parallel stripes of different precursor materials on the material carrier element flexible tape backing element which may be accessed without having to change tapes. For example, if a structure comprising many repeating stacked layers of two or more different materials is to be manufactured, the multi-track actuator of the tape material carrier element 14 will have the ability to switch materials from one track to another in milliseconds, a speed which has not yet been attained by any prior art commercial techniques.

Projected write speeds with high repetition rate lasers will require tape velocities of the order of meters per second with material carrier element area consumption rates of 1–10 cm$^2$ per second. A thin flexible tape, stored on rolls, is a rugged and economical way to access large areas of surface. The matrix and powder are deposited as a thin 1–2 micron layer on a transparent tape backing. An easily handled 8" diameter reel holds approximately 1,200 meters of 1-mil tape.

As the material carrier element has to be maintained a predetermined distance from the substrate surface, fixed spacers may be used which are low friction membranes or shim elements which can be coated with friction reducing coating structures, including Teflon, Graphite, and $M_oS_2$. The material carrier element may be fixed to the substrate to maintain its position by a vacuum position control. The fixed substrate and material carrier element may be manipulated on an air bearing to position the laser addressing element in the path of the laser beam.

A pulse position synchronization control system can be used in conjunction with the material carrier element for precise coordination between the actuation/deactuation of the laser with the relative motion of the material carrier element and the laser.

As described above, the present invention provides a unique implementation of material delivery systems to enable an additive, Direct Write process with the ability to create complex circuits of structures in a conformal manner on a wide variety of substrates.

The additive process may be Laser Forward Transfer, such as Matrix Assisted Pulsed Laser Evaporation, or Laser Induced Forward Transfer of homogeneous thin films. Additive structures may comprise a wide variety of different detectors and sensors, mechanical and electromechanical elements and actuators, as well as common types of passive electron components.

The material carrier element which is part of the unique material supply system of the present invention described herein enables a wide variety of materials to be accurately positioned near the substrate for subsequent transfer process. Direct Write Forward Transfer techniques carried out in the fabrication tool of the present invention is easily converted into micromachining, i.e., a subtractive process. In the subtractive mode of operation, the fabrication tool 10 acts as a micromachining workstation utilizing laser energy to ablate and evaporate, melt, cut, drill, or otherwise remove material from the workpiece. In this way, channels, guides, via, can be laser milled or drilled, as well as diced or excised into individual subunits from a larger substrate. Thus, the existing structures can be trimmed or shaped to precise specified values. By adjusting the UV laser fluence to approximately 1 J/CM$^2$ or greater, vias through the substrate can be drilled with micron precision. Channels for positioning external contacts or laying subsurface components can be excavated with ease. Microfluidic structures functioning as chemical sensors or biological agent detectors may be embedded directly in the same substrate. By decreasing spot fluence to approximately 100 MJ/CM$^2$ or less, the ablation rate will drop to substantially zero but may still be more than sufficient to expose sensitive materials.

In the additive mode of operation, the Direct Write laser might expose positive or negative resists, epoxies, or other photosensitive materials in complex patterns, with high spatial resolution. Such a capability would even permit stereo lithographic fabrication of three-dimensional structures. The elements and structures manufactured in the fabrication tool of the present invention are easily and flexibly customized.

The core of the unique material delivery system 32 of the present invention is the material carrier element which is capable of being intercepted with the laser beam or being removed from interception with the laser beam by means of the control unit 18, thus accommodating tasks such as laser surface cleaning, as well as direct deposit of metals, ceramics, and polymers in an air atmosphere and at room temperatures.

The fabrication tool of the present invention can both transfer material to the substrate in a patterned manner and remove material from the substrate in a patterned manner as well. As both operations can be done in a single machine, the substrate can remain in place and possible in problems, such as misalignment or contamination, which result from removing a substrate from a tool, are avoided.

The advantages of the fabrication technique of the present invention have been attained due to the design of the apparatus 10, and particularly due to a functional performance and operational approach of the control unit 18, best shown in FIGS. 8–12. The control unit 18 coordinates all aspects of deposition/ablation process;

provides interfacing for an operator control and monitoring;

monitors all critical subsystems (including optical systems) of the apparatus 10 for quality control and safety;

provides communication with external systems and data bases, both internal and external; and provides for compatibility with CAD/CAM control.

Figure 8:
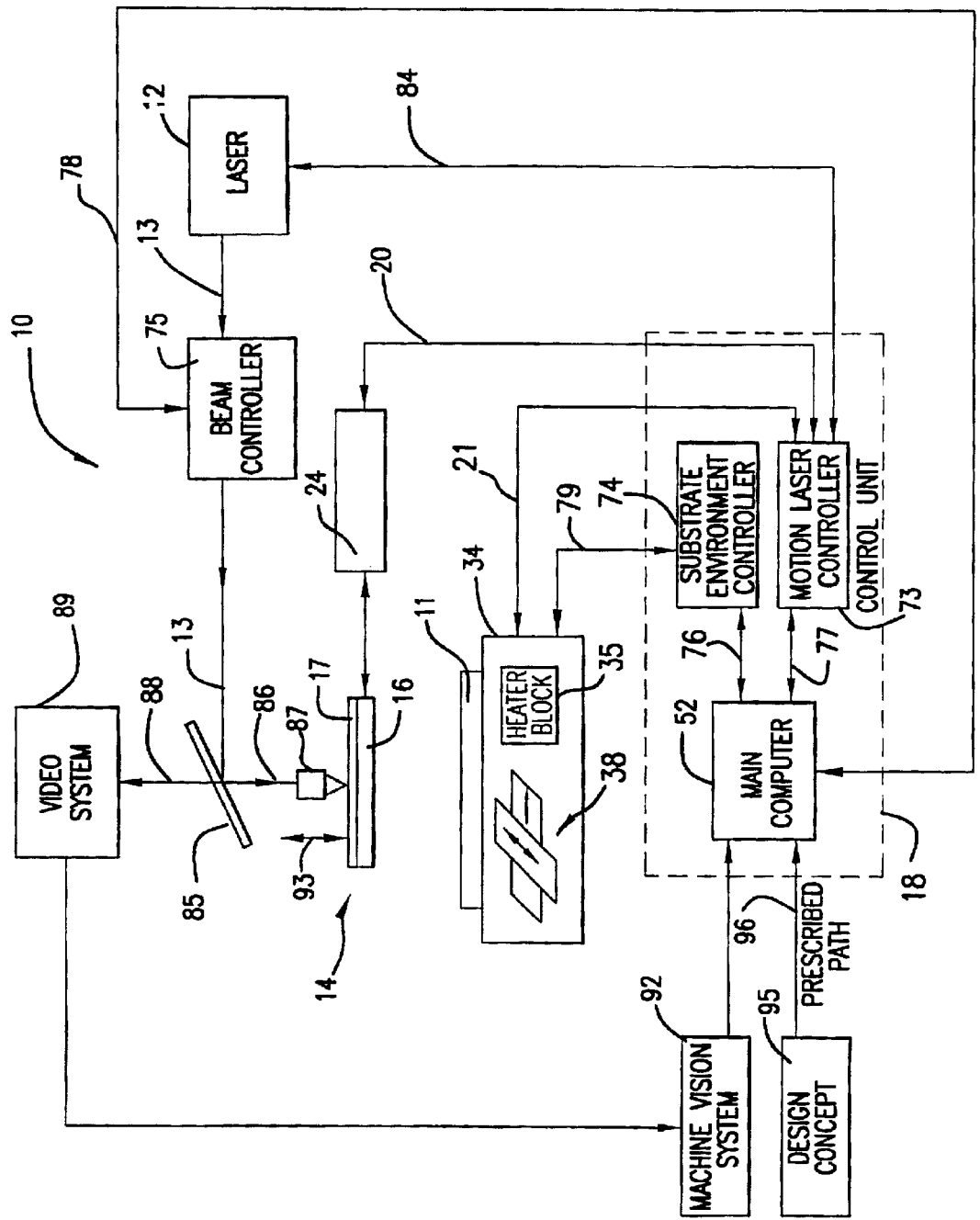
FIG. 8 is an overall block diagram of the apparatus of the present invention.

Referring to FIG. 8, showing the overall block diagram of the system of the present invention, the control unit 18 includes a main computer 72, motion/laser controller 73, substrate environment controller 74, and a beam controller 75. The main computer 72 interchanges data with the substrate environment controller 74 through bi-directional channel 76, and with the motion/laser controller 73 through the bi-directional communication channel 77.

The motion/laser controller 73, is external or internal to the main computer 72, provides accurate (approximately 1 micron) dynamic closed loop position control of the substrate, material carrier element, and scanning laser beam. The motion-laser controller 73 moves substrate with high speed (up to 1 meter per second) and accuracy (approximately 1 micron) as well as provides for smoothness of travel for patterned deposition or ablating micromachining. Also, the main computer 72 communicates with the beam controller 75 through the bi-directional communication channel 78.

The substrate environment controller 74 is bi-directionally coupled through the communication link 79 to a substrate fixture 34 supporting the substrate 11 thereon. The substrate fixture 34 (along with the substrate environment controller 74 and the motion/laser controller 73) provides for holding the substrate reliably, keeps it at required level, controls its temperature as well as atmosphere. The substrate fixture 34 includes a temperature control heater block 35 which is controlled in a closed loop fashion by the substrate environment controller 74 for controlling deposition conditions of the system 10.

The substrate fixture 34 includes X-Y stages 38, best shown in FIGS. 3, 4A, 8 and 9, which being controlled by the motion/laser controller 73, provide for a required displacement of the substrate 11 in accordance to a prescribed path, as will be described in detail in further paragraphs with reference to FIG. 9. For controlling and monitoring the displacement and position of the substrate 11, the bi-directional communication link 21 operatively couples the X-Y stages 38 of the substrate fixture 34 with the motion/laser controller 73 to convey control signals to the fixture 34 and readings of the position to the motion/laser controller 73.

The motion/laser controller 73 further communicates with the material carrier element 14 through the bi-directional communication channel 20 which has included therein the mechanism 24 (best shown in FIGS. 4A–5) responsible for mechanical displacement of the material carrier element 14 either into intercepting position with the laser beam 13 (in the "material transfer" mode of operation) or away from interception with the laser beam 13 (in the "material removal" mode of operation). The mechanism 24 also changes a position of the material carrier element with regard to the laser beam 13 according to the prescribed path for attaining the effective utilization of the depositable material of the deposition layer 16, deposition of a specific depositable material contained in the deposition layer 16, and deposition of the depositable material on an aimed area of the substrate 11. As will be described in detail in the following paragraphs, depending on the type of the material carrier element 14, the mechanism 24 has distinctive design features adapted for the particular type of the material carrier element, but which in any event, mechanically displaces the material carrier element 14 as prescribed by the motion/laser controller 73 through the channel 20.

The control unit 18, as can be seen in FIG. 8, is operatively coupled to the laser system 12 through the communication channel 19 which includes the communication channel 78 for providing coupling between the main computer 72 and the beam controller 75, and the communication channel 84 for providing a bi-directional coupling between the motion/laser controller 73 and the laser 12, as will be described in detail further.

The laser 12 provides focusable pulsed energy source serving to:

transfer material from the deposition layer 16 to the substrate 11 in the "material transfer" mode of operation;

ablatively remove the material from the surface of the substrate 11 in the "material removal" mode of operation;

remove foreign material from the substrate and/or prepare and activate the substrate surface before or after deposition in the "material removal" mode of operation, particularly "cleaning" mode of operation; and shape and refine deposited or existing structures to desired dimensions or values in the "material removal" mode of operation, particularly "laser trimming" mode of operation.

An discussed in the previous paragraphs, the ultraviolet pulsed laser is preferred due to superior ablation characteristics for many materials. Specifically, all solid state frequency tripled neodymium vanadate lasers (radiating at approximately 355 nm), and frequency quadrupled energy laser (radiating approximately at 266 nm) are preferred because they offer high repetition rates, short pulses, sufficient beam quality, high average power, and superior reliability at low maintenance. The laser is beam 13 generated by the laser 12, is controlled by the beam controller 75 under the overall control and monitoring of the main computer 72.

As disclosed in previous paragraphs, the beam control is embedded in the system 10 of the present invention in order to deliver the laser beam of the desired optimal laser spot size, shape, and fluence to the material carrier element 14 or to the surface of the substrate 11. Beam shape and size determines the resolution and pattern of the deposition or ablation. Once the shape, size and fluence of the laser beam 13 has been attained, the laser beam impinges upon the splitter 85 whereat the laser beam 13 splits into a beam 86 directed to the objective 87 which further focuses the beam 86 and directs the same to either the surface of the material carrier element 14 or to the surface of the substrate 11. The mirror splitter 85 is highly reflective at laser wavelength but transparent for invisible spectrum for the video system 89.

Figure 10:
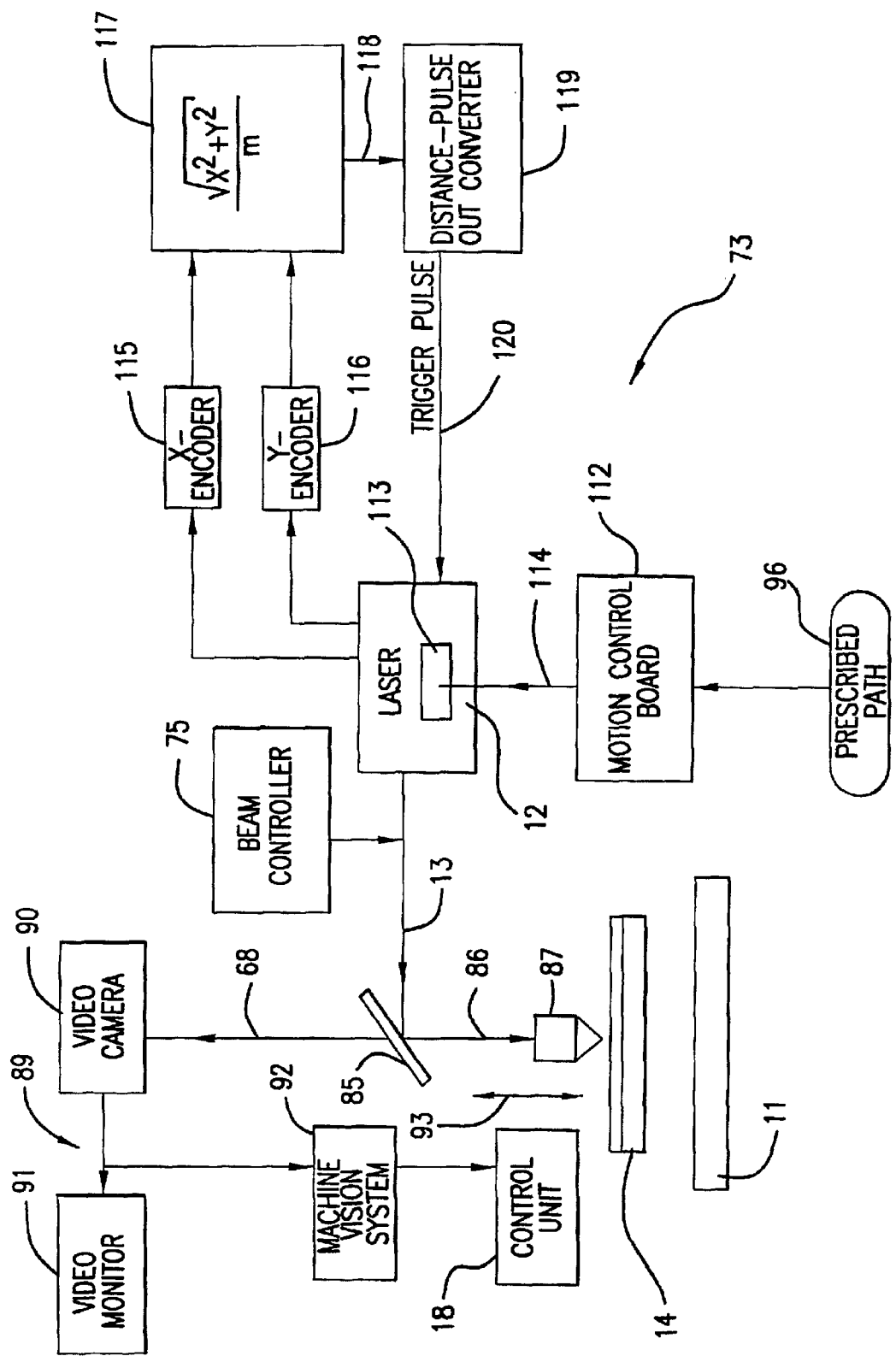
FIG. 10 is a block diagram of a controller subsystem for laser motion and laser actuation-deactuation control of the apparatus of the present invention.

Another portion of the laser beam 13, particularly the beam 88, is directed by the splitter 85 to a video system 89 which includes a video microscope/video camera 90 and a video monitor 91, best shown in FIG. 10. The signal from the video microscope/video camera 90 is supplied to a machine vision system 92 for image capture and processing. The video system/machine vision system permits an operator to accurately position substrate for registration and scaling with existing pattern;

to measure and inspect the substrate; and to facilitate leveling, focusing and displacement of the substrate and the objective 87 in the directions shown by arrows 93 and 94. The optical subsystem of the apparatus 10 of the present invention which includes the video system 89, including a video microscope/video camera 90, video monitor 91, and the machine vision system 92 is a well-known machine vision technique and is not intended to be described herein in further detail. The data from the machine vision system 92 are transmitted to the main computer 72 for storing, further processing, and for communication with the motion/laser controller 73 through the communication channel 77 for further control of the relative disposition between the elements of the system 10, as well as actuation-deactuation of the laser 12.

Figure 9:
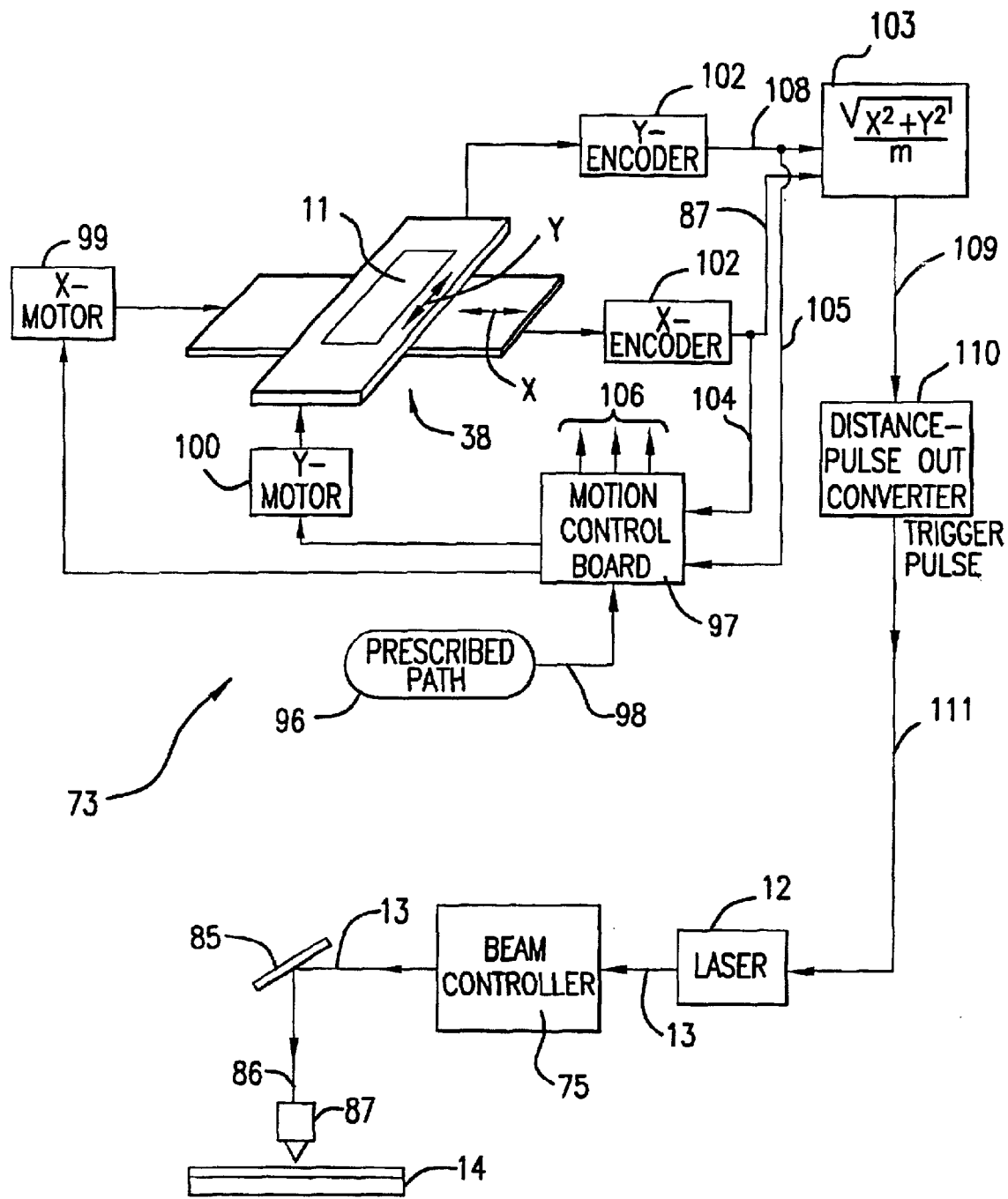
FIG. 9 is a block diagram of a controller subsystem of the apparatus of the present invention coordinating the substrate motion and laser activation-deactivation.

Referring now to FIG. 9, showing a block diagram of the substrate motion/laser controller 73 for substrate motion and laser activation-deactivation control, the motion/laser controller 73, either external or internal to the main computer 72, provides accurate (approximately 1 micron) dynamic closed loop position control of the substrate. In this manner, the controller 73 monitors real time position of the substrate and coordinates the same with generating of laser pulses so that the laser pulses can be triggered with very high alignment accuracy.

It is clear that if the laser beam is delivered at constant repetition rate to either the material carrier element, or the substrate, the pulses tend to "pile up" during acceleration and deceleration of the X-Y stages 38, or mechanical displacement mechanism 24, or laser beam displacement mechanism (to be discussed further in detail with the reference to FIG. 10) and makes deposition and ablation depth control difficult. To obviate these unwanted phenomena, the actuation of the laser is to be coordinated with deposition of the substrate, laser beam, and/or material carrier element in real time fashion. As best shown in FIG. 9, the main computer 72, through the motion-laser controller 73, transmits signals representative of a prescribed path (received from the "Design Concept" block 95 of the FIG. 8) which is a CAD/CAM developed design concept for layout of miniature structures or micromachining layout) is supplied to the motion control board 97 via a channel 98. The motion control board 97 in accordance with the prescribed path controls an X-motor 99 and a Y-motor 100 to force the X-Y stages 38 carrying the substrate 11 to move the same in required direction a required distance. At the same time, an X-encoder 101 is coupled to the X-stage 38, and the Y-encoder 102 is coupled to the Y-stage 38 for measuring x and Y displacements of the X-Y stages 38 and translating them into the format understood by the motor control board 97 and the processing block 103. The data from X-encoder 101 and Y-encoder 102 are supplied through the channels 104 and 105, respectively to the motion control board 97 for being processed and used for generating various control signals outputted through outputs 106. These control signals may be further transmitted to the optical system 122 (best shown in FIG. 11) of the laser 12 for controlling the laser shutters, laser optical zoom, aperture selection, etc.

Simultaneously, the data corresponding to X and Y displacements of the X-Y stages 38 are transmitted from the X-encoder 101 and Y-encoder 102 through the communication links 107 and 108, respectively, to the processing block 103 wherein the X and Y displacements are processed and calculated according to the formula $$\left(\frac{X^2+Y^2}{m}\right),$$

wherein X is a displacement of the X stage 38, Y is Y displacement of the Y stage 38; and m is an integer defining the number of pulses for each displacement vector. The data from the processing block 103 is outputted through the channel 109 to a "distance-to-pulse out" converter 110. The converter 110 thus receives vector displacement increment and in response thereto, generates a trigger pulse which is transmitted to the laser 12 through the line III for actuating-deactuating the laser 12. Thus, the laser 12 generates laser beam 13 once a required displacement of the substrate 11 has been attained. The "distance-to-pulse out" converter 110 is a converter manufactured by Aerotech, Inc. for operation of the known micromachining stations.

As was described in previous paragraphs, change of the relative disposition between the laser beam, substrate and/or material carrier element, may be implemented in following three fashions:

movement of the substrate with respect to the immovable laser beam;

scanning of the laser beam with regard to the substrate and/or material carrier element; and combinatorial motion of the substrate and the laser beam. Thus, when scanning of the laser beam with respect to the substrate and/or material carrier element is chosen for operation, the system 10 of the present invention will operate in accordance with FIG. 10, illustrating the motion/laser controller 73, particularly, a subsystem thereof for laser motion and laser actuation-deactuation control. As shown in FIG. 10, data representative of the prescribed path 96 are supplied to the motion control board 112 (which may coincide with the motion control board 97). The motion control board 112, in the manner described with respect to FIG. 9, transmits control signal over the line 114 either to the unit 113 which may include either the optical system of the laser 12 or mechanical stages carrying the laser 12 for displacement of the laser beam generated by the laser 12, thus providing scanning of the laser beam over the surface of the material carrier element 14 or the substrate 11. X and Y encoders 115 and 116 (or other means sensing displacement of the scanning laser beam) receive information from the "optical system/stages" unit 113 of the laser 12 and transmit this information to a processing block 117 which processes the information received from the encoder 115, 116 either in the same manner as the processing block 103 of FIG. 9, or in any other fashion known to those skilled in the art, and outputs the data representative of the displacement of the laser beam through the line 118 to the "distance-to-pulse out" converter 119 (which may coincide with the converter 110 of FIG. 9) which in well-known manner converts the data representative of the displacement of the scanning laser beam into the controlling trigger pulses which are supplied to the laser 12 through the line 100 for actuating/deactuating the laser 12. The generated laser beam 13 is further controlled by the beam controller 75 and is further directed to the material carrier element 14 or the substrate 11 as described in the previous paragraphs. In this manner, the firing of the laser beam will be coordinated in precise fashion with the scanning of the laser beam with regard to the substrate 11 or the material carrier element 14.

Figure 11:
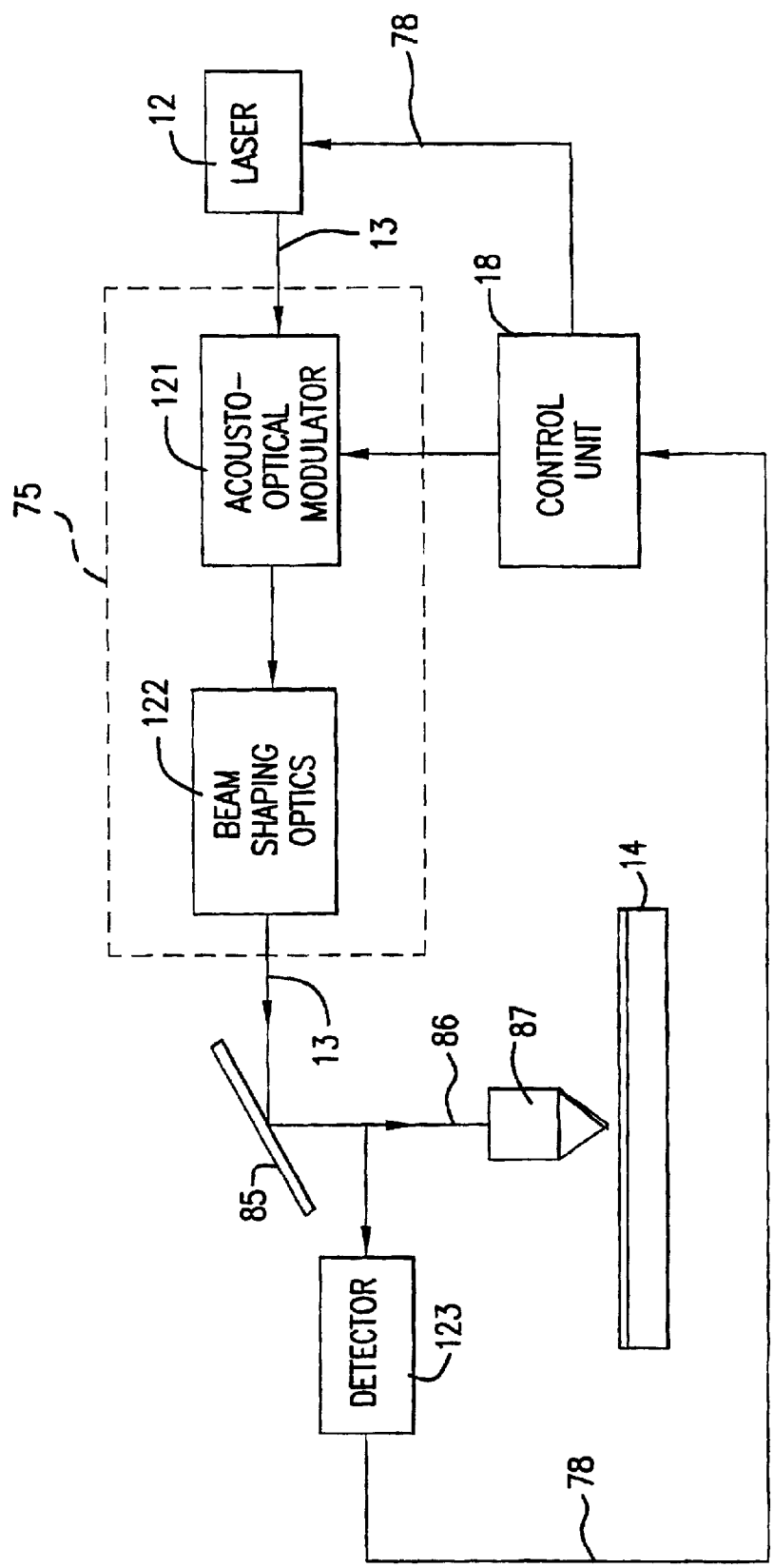
FIG. 11 is a block diagram of the beam control subsystem of the apparatus of the present invention.

Referring to FIG. 11, the beam controller 75 facilitates in delivery of the laser beam of the desired optimal laser spot size, shape, and fluence to the substrate or to the material carrier element. The beam controller 75 includes an acousto-optic modulator 121 coupled to the laser 12 to rapidly (faster than 100 ms) shutter the laser "on" or "off" as well as to control the energy of the individual generated laser pulses dynamically. The acousto-optic modulator 121 external to the laser cavity allows the laser to run at constant repetition rate for maximum stability. Throughput efficiency of the acousto-optic modulator can be controlled by the motion/laser controller 73 in the range between 0% to more than 90%.

A beam shaping optics 122 is coupled to the acousto-optic modulator 121 to control size and shape of the laser beam at the target. The beam shaping optics 122 includes an optical zoom, shaped aperture array, and/or diffractive optic beam shaper.

The control of the power and generation of the laser beam is an important feature since fluences of the generated laser beam are to be maintained at different levels for different purposes. For instance, for deposition, an optimal fluence is kept usually in the range of 0.2–2.0 J/Cm$^2$ per pulse. For ablation micromachining, generally high fluences are desired for maximum speed and efficiency, typically approximately 1–100 J/CM$^2$ per pulse. Lower fluences, approximately 0.2–2.0 J/CM$^2$ can be used for precise depth control. Using the structure of the system of the present invention, sub-micron depth control has been demonstrated.

The laser beam having the required fluence (provided by the acouso-optical modulator 121) and required size and shape (provided by the beam shaping optics 122) is further outputted to the splitter 85 for further traveling to the target (material carrier elements 14 or the substrate 11) through the objective 87. The objective 87 is provided for final imaging of the UV laser beam and video magnification. The objective 87 is mounted on a focusing stage providing displacement in the direction shown by arrows 93 to permit proper imaging regardless of the substrate height, and regardless of whether the material carrier element is in the beam path.

A detector 123 monitors laser pulse energy and supplies data representative of the real time laser beam energy to the control unit 18 for closed loop control.

Figure 12:
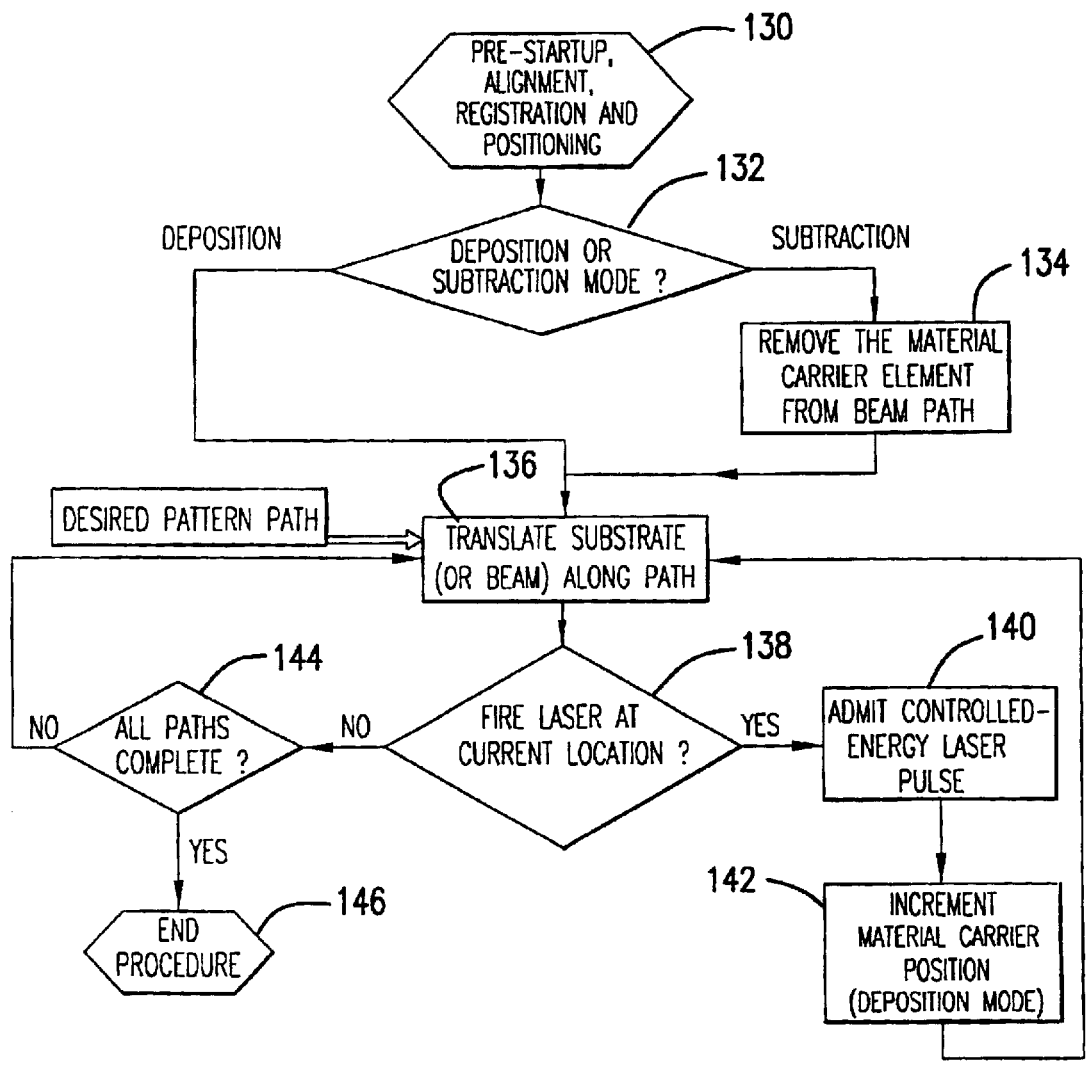
FIG. 12 is a flow chart diagram of the computer controlled operational principle of the control unit of the apparatus of the present invention.

Referring to FIG. 12, showing a block diagram of the programmed operational principles of the control unit of the apparatus of the present invention, the flow chart begins with the block 130 corresponding to the pre-start-up procedure which includes alignment of the elements (substrate, material carrier element, laser beam) of the system, registration and positioning. Initially, the material carrier element is maintained in interception position with the laser. From the block 130, the logic moves to the block 132 "Deposition or Subtraction Mode?" If a subtraction (material removal mode of operation) is chosen, the logic moves to the block 134 "Remove material carrier element from the beam path". In accordance with the command of the block 134, the control unit 18 then outputs a control signal to mechanism 24, best shown in FIG. 8, for removing the material carrier element 14 away from the interception position with the laser beam 13.

From the block 134, the logic is directed to the block 136 "Translate Substrate (or Beam) along Prescribed Path".

If in the logic block 132, the deposition ("material transfer" mode of operation) is chosen, the logic moves to the block 136. The logic block 136 receives a "Desired Pattern Path" which corresponds to the prescribed path 96 best shown in FIGS. 8–10. Thus, upon receiving the desired pattern path, the block 136 changes relative disposition between the substrate and the beam in accordance with the prescribed path.

From the block 136, the flow chart moves to the logic block 138 "Fire Laser at Current Location?". If the laser has to be fired, i.e., the answer is "Yes", the logic moves to the block 140 "Admit Controlled-Energy Laser Pulse". At this instance, the motion/laser controller 73, as best shown in FIGS. 8–12, "commands" the laser 12 to generate a laser pulse which impinges at a predetermined area of the substrate 11 (in the "material removal" mode of operation), or the material carrier element 14 (in the "material transfer" mode of operation). After the laser beam modifies either the deposition layer 16 of the material carrier element 14 or the surface of the substrate 11, the flow chart moves to the logic block 142 "Increment Materials Carrier Position (Deposition Mode)". In this instance, the control unit 18 deactuates the laser 12, thus seizing the laser beam, and moves the material carrier element 14 to the next position according to the prescribed path 96 if the apparatus 10 operates in the "materials transfer" mode of operation.

If however the apparatus 10 operates in the "material removal" mode of operation, the control unit 18 seizes the laser beam and moves the substrate to the next position in accordance with the prescribed path 96. Thus, from the logic block 142, the flow chart returns to the logic block 136, where the translation of the substrate (or the laser beam) is performed along with the prescribed path 96.

If however the answer to the logic block 138 is "No", meaning that the laser is not to be fired at a current location of the substrate or the laser beam, the logic flows to the block 144 "All Paths Complete?". If the answer is "Yes", the logic flows to the "End Procedure" block 146.

If however, in the logic block 144, it is decided that not all prescribed paths have been yet completed, i.e., the answer is "No", the logic returns to the block 136 to translate the substrate (or the laser beam) along the prescribed path 96 for further leading the flow chart either along the loop comprised of logic blocks 138, 140, 142 and 136; or along the loop comprised of the logic blocks 138, 144, 136, in sequence.

Although this invention has been described in id connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A material delivery system for miniature structures fabrication, comprising:
    a substrate;
    a material carrier element having a deposition layer disposed thereon and displaceable with respect to said substrate, said deposition layer containing at least one depositable material, said material carrier element being maintained in predetermined spaced relationship with respect to said substrate;
    an energy beam directed towards said material carrier element; and
    control means operatively coupled to said energy beam and said material carrier element for changing relative position between said material carrier element and said energy beam, thereby exposing respective areas of said deposition layer to said energy beam in a patterned fashion, said at least one depositable material being ablated from said respective areas of said deposition layer upon exposure to said energy beam, transferring to said substrate for depositing thereon at regions thereof corresponding to said respective areas of said deposition layer on said material carrier element.

2. The material delivery system of claim 1, wherein a distance between said material carrier element and said substrate does not exceed 25 μm.

3. The material delivery system of claim 1, wherein said control means scan said energy beam over said material carrier element.

4. The material delivery system of claim 1, wherein said control means controls a size of cross-section of said energy beam.

5. The delivery system of claim 1, wherein said control means controls a shape of cross-section of said energy beam.

6. The material delivery system of claim 1, wherein said energy beam includes a laser beam.

7. The material delivery system of claim 6, wherein said laser beam includes an ultraviolet laser beam.

8. The material delivery system of claim 7, wherein said material carrier element is transparent to the ultraviolet radiation.

9. The material delivery system of claim 1, further comprising a substrate-holding unit supporting said substrate in substantially parallel relationship to said material carrier element.

10. The material delivery system of claim 1, wherein said control means further includes pulse-position synchronization means for coordination between events of exposure of said deposition layer to said energy beam and the relative disposition of said material carrier element, said substrate and said source of energy.

11. The material delivery system of claim 1, wherein said material carrier element includes a tape material carrier element, said system further includes:
    a take-up reel and a supply reel supporting said tape material carrier element at two opposing ends thereof in a lengthwise slidable relationship with respect to said substrate, and
    a tape guide unit disposed between said take-up reel and said supply reel and maintaining said tape material carrier element in predetermined relative disposition with respect to said substrate.

12. The material delivery system of claim 11, further including:
    an actuator block operatively coupled to said tape guide unit for stepping said tape material carrier element in a direction substantially normal to said tape material carrier element travel and in parallel to said substrate forming a deposition layer in multiple parallel tracks fashion.

13. The material delivery system of claim 1, further comprising a tape guide unit supporting said material carrier element in said predetermined relationship with respect to said substrate.

14. A material deliver system for miniature structures fabrication, comprising:
a substrate;
a material carrier element having a deposition layer disposed thereon and displaceable with respect to said substrate, said deposition layer containing at least one depositable material;
an energy beam directed towards said material carrier element; and
control means operatively coupled to said energy beam and said material carrier element for changing relative position between said material carrier element and said energy beam, thereby exposing respective areas of said deposition layer to said energy beam in a patterned fashion, said at least one depositable material being ablated from said respective areas of said deposition layer upon exposure to said energy beam, transferring to said substrate for depositing thereon at regions thereof corresponding to said respective areas of said deposition layer on said material carrier element, said control means manipulating said material carrier element with respect to said energy beam.

15. A material delivery system for miniature structures fabrication, comprising:
a substrate;
a material carrier element having a deposition layer disposed thereon and displaceable with respect to said substrate, said deposition layer containing at least one depositable material, said deposition layer of said material carrier element including a plurality of distinct depositable materials disposed at predetermined zones oil said material carrier element;
an energy beam directed towards said material carrier element; and
control means operatively coupled to said energy beam and said material carrier element for changing relative position between said material carrier element and said energy beam, thereby exposing respective areas of said deposition layer to said energy beam in a patterned fashion, said at least one depositable material being ablated from said respective areas of said deposition layer upon exposure to said energy beam, transferring to said substrate for depositing thereon at regions thereof corresponding to said respective areas of said deposition layer on said material carrier element.

16. The material delivery system of claim 15, wherein said control means aligns said energy beam with a respective one of said predetermined zones for depositing of a required depositable material contained in said respective zone.

17. The material delivery system of claim 15, wherein said predetermined zones of said plurality of materials of said deposition layer are arranged in multiple annular manner.

18. A material delivery system for miniature structures fabrication, comprising:
a substrate;
a material carrier element having a deposition layer disposed thereon and displaceable with respect to said substrate, said deposition layer containing at least one depositable material;
an energy beam directed towards said material carrier element; and
control means operatively coupled to said energy beam and said material carrier element for changing relative position between said material carrier element and said energy beam, thereby exposing respective areas of said deposition layer to said energy beam in a patterned fashion, said at least one depositable material being ablated from said respective areas of said deposition layer upon exposure to said energy beam, transferring to said substrate for depositing thereon at regions thereof corresponding to said respective areas of said deposition layer on said material carrier element, said control means operating said material delivery system in either of a direct write mode of operation and a micromachining mode of operation, said material carrier element being positioned in said direct write mode of operation in interception with said energy beam, and said material carrier element being displaced in said micromachining mode of operation away from intercepting with said energy beam, thus allowing a direct access for said energy beam to said substrate for ablating said substrate in a patterned fashion.

19. The material delivery system of claim 18, wherein in said micromachining mode of operation, a fluence of said energetic beam is at least $1 J/CM^2$ for ablating said substrate in said patterned fashion.

20. A material delivery system for miniature structures fabrication, comprising:
a substrate;
a material carrier element having a deposition layer disposed thereon and displaceable with respect to said substrate, said deposition layer containing at least one depositable material, said material carrier element including:
(a) a disc material carrier element,
(b) an air table having a plurality of orifices, and
(c) a gas supply means forcing said gas through said orifices, whereby a gas cushion layer is created above said air table, said disc material carrier element being supported upon said gas cushion layer in rotational relationship therewith about an axis of rotation extending through the center of said disc material carrier element;
an energy beam directed towards said material carrier element; and
control means operatively coupled to said energy beam and said material carrier element for changing relative position between said material carrier element and said energy beam, thereby exposing respective areas of said deposition layer to said energy beam in a patterned fashion, said at least one depositable material being ablated from said respective areas of said deposition layer upon exposure to said energy beam, transferring to said substrate for depositing thereon at regions thereof corresponding to said respective areas of said deposition layer on said material carrier element.

21. The material delivery system of claim 20, wherein said disc material carrier element is rotated at a rate determined by said energy beam repetition rate and a distance of said energy beam from said axis of rotation for arranging said respective areas of said deposition layer exposed to said energy beam in a substantially close-packed manner.

22. The material delivery system of claim 20, wherein said disc material carrier element is slidably displaceable substantially in parallel with respect to said substrate and independently thereof.

23. The material delivery system of claim 20, wherein said substrate is independently displaceable substantially in parallel relation with respect to said disc material carrier element.

24. A material delivery system for miniature structures fabrication, comprising:
- a substrate;
- a material carrier element having a deposition layer disposed thereon and displaceable with respect to said substrate, said deposition layer containing at least one depositable material, said material carrier element including a tape material carrier element;
- a take-up reel and a supply reel supporting said tape material carrier element at two opposing ends thereof in a lengthwise slidable relationship with respect to said substrate, said lengthwise slidable motion of said tape material carrier element with respect to said substrate being a bidirectional motion;
- a tape guide unit disposed between said take-up reel and said supply reel and maintaining said tape material carrier element in predetermined relative disposition with respect to said substrate;
- an energy beam directed towards said material carrier element; and
- control means operatively coupled to said energy beam and said material carrier element for changing relative position between said material carrier element and said energy beam, thereby exposing respective areas of said deposition layer to said energy beam in a patterned fashion, said at least one depositable material being ablated from said respective areas of said deposition layer upon exposure to said energy beam, transferring to said substrate for depositing thereon at regions thereof corresponding to said respective areas of said deposition layer on said material carrier element.

25. A material delivery system for miniature structures fabrication, comprising:
- a substrate;
- a material carrier element having a deposition layer disposed thereon and displaceable with respect to said substrate, said deposition layer containing at least one depositable material, said material carrier element including a tape material carrier element;
- a take-up reel and a supply reel supporting said tape material carrier element at two opposing ends thereof in a lengthwise slidable relationship with respect to said substrate;
- a tape guide unit disposed between said take-up reel and said supply reel and maintaining said tape material carrier element in predetermined relative disposition with respect to said substrate;
- an actuator block operatively coupled to said tape guide unit for stepping said tape material carrier element in a direction substantially normal to said tape material carrier element travel and in parallel to said substrate forming a deposition layer in multiple parallel tracks fashion, each said stepping of said tape material carrier element in the multiple parallel tracks fashion is carried out after a full length of said tape material element has passed in a predetermined direction of the lengthwise motion thereof;
- an energy beam directed towards said material carrier element; and
- control means operatively coupled to said energy beam and said material carrier element for changing relative position between said material carrier element and said energy beam, thereby exposing respective areas of said deposition layer to said energy beam in a patterned fashion, said at least one depositable material being ablated from said respective areas of said deposition layer upon exposure to said energy beam, transferring to said substrate for depositing thereon at regions thereof corresponding to said respective areas of said deposition layer on said material carrier element.

26. A material delivery system for miniature structures fabrication, comprising:
- a substrate;
- a material carrier element having a deposition layer disposed thereon and displaceable with respect to said substrate, said deposition layer containing at least one depositable material, said material carrier element including a tape material carrier element;
- a take-up reel and a supply reel supporting said tape material carrier element at two opposing ends thereof in a lengthwise slidable relationship with respect to said substrate;
- a tape guide unit disposed between said take-up reel and said supply reel and maintaining said tape material carrier element in predetermined relative disposition with respect to said substrate;
- an actuator block operatively coupled to said tape guide unit for stepping said tape material carrier element in a direction substantially normal to said tape material carrier element travel and in parallel to said substrate forming a deposition layer in multiple parallel tracks fashion, each of said parallel tracks contains a respective one of a plurality of depositable materials;
- an energy beam directed towards said material carrier element; and
- control means operatively coupled to said energy beam and said material carrier element for changing relative position between said material carrier element and said energy beam, thereby exposing respective areas of said deposition layer to said energy beam in a patterned fashion, said at least one depositable material being ablated from said respective areas of said deposition layer upon exposure to said energy beam, transferring to said substrate for depositing thereon at regions thereof corresponding to said respective areas of said deposition layer on said material carrier element.

* * * * *